(12) United States Patent
Mitra

(10) Patent No.: US 10,725,374 B2
(45) Date of Patent: Jul. 28, 2020

(54) TEMPLATE SUBSTRATE, METHOD OF MANUFACTURING TEMPLATE SUBSTRATE, AND METHOD OF MANUFACTURING SEMICONDUCTOR DEVICE

(71) Applicant: TOSHIBA MEMORY CORPORATION, Minato-ku, Tokyo (JP)

(72) Inventor: Anupam Mitra, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 50 days.

(21) Appl. No.: 15/910,314

(22) Filed: Mar. 2, 2018

(65) Prior Publication Data
US 2019/0079393 A1 Mar. 14, 2019

(30) Foreign Application Priority Data
Sep. 12, 2017 (JP) .................. 2017-174972

(51) Int. Cl.
| | | |
|---|---|---|
| G03F 7/00 | (2006.01) |
| H01L 21/027 | (2006.01) |
| B29C 59/00 | (2006.01) |
| G03F 1/60 | (2012.01) |
| B29C 59/02 | (2006.01) |
| B29L 31/34 | (2006.01) |
| B29C 33/38 | (2006.01) |
| H01L 21/3105 | (2006.01) |

(52) U.S. Cl.
CPC .......... *G03F 7/0002* (2013.01); *B29C 59/002* (2013.01); *B29C 59/026* (2013.01); *G03F 1/60* (2013.01); *H01L 21/027* (2013.01); *B29C 33/3842* (2013.01); *B29L 2031/3406* (2013.01); *H01L 21/3105* (2013.01)

(58) Field of Classification Search
None
See application file for complete search history.

(56) References Cited

U.S. PATENT DOCUMENTS

| 2002/0094496 A1* | 7/2002 | Choi ................. B82Y 10/00 430/322 |
| 2012/0308680 A1* | 12/2012 | Inoue .................... G03F 7/0002 425/385 |
| 2017/0021607 A1 | 1/2017 | Matsuoka et al. |

FOREIGN PATENT DOCUMENTS

| JP | 2015-214449 A | 12/2015 |
| JP | 2016-119391 A | 6/2016 |
| JP | 2016-149578 A | 8/2016 |
| WO | WO-2015/108002 A1 | 7/2015 |

* cited by examiner

*Primary Examiner* — Anthony Ho
*Assistant Examiner* — Kevin Quinto
(74) *Attorney, Agent, or Firm* — Foley & Lardner LLP

(57) ABSTRACT

A template substrate includes a pedestal portion on a first surface of a substrate. The template substrate defines an opening region provided in a second surface opposite to the first surface of the substrate. The opening region includes an opening end on a second surface side of the opening region corresponding to the second surface and a bottom surface on a first surface side of the opening region corresponding to the first surface. An area of the opening end is different from an area of the bottom surface.

4 Claims, 9 Drawing Sheets

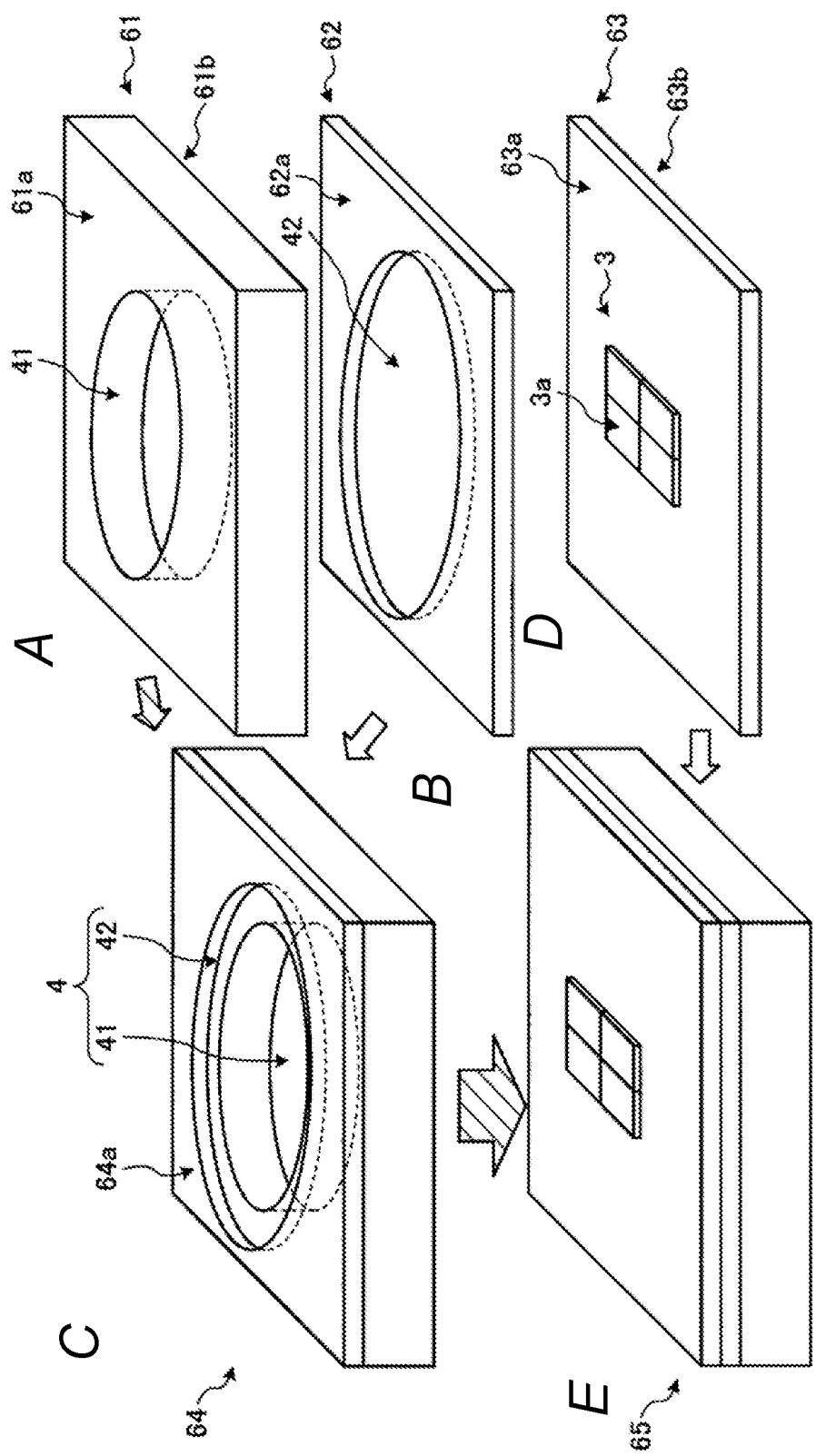

TEMPLATE SUBSTRATE, METHOD OF MANUFACTURING TEMPLATE SUBSTRATE, AND METHOD OF MANUFACTURING SEMICONDUCTOR DEVICE

CROSS-REFERENCE TO RELATED APPLICATION

This application claims the benefit of and priority to Japanese Patent Application No. 2017-174972, filed Sep. 12, 2017, the entire contents of which are incorporated herein by reference.

FIELD

Embodiments described herein relate generally to a template substrate, a method of manufacturing the template substrate, and a method of manufacturing a semiconductor device.

BACKGROUND

In imprint lithography used in a semiconductor process, a template substrate having a step structure is formed, and a template is formed by forming a pattern on a surface of the step structure of the template substrate. An improved structure for the template substrate would be useful.

DESCRIPTION OF THE DRAWINGS

FIG. 6 shows views illustrating a method of manufacturing the template substrate according to one or more embodiments.

DETAILED DESCRIPTION

Figure 1:
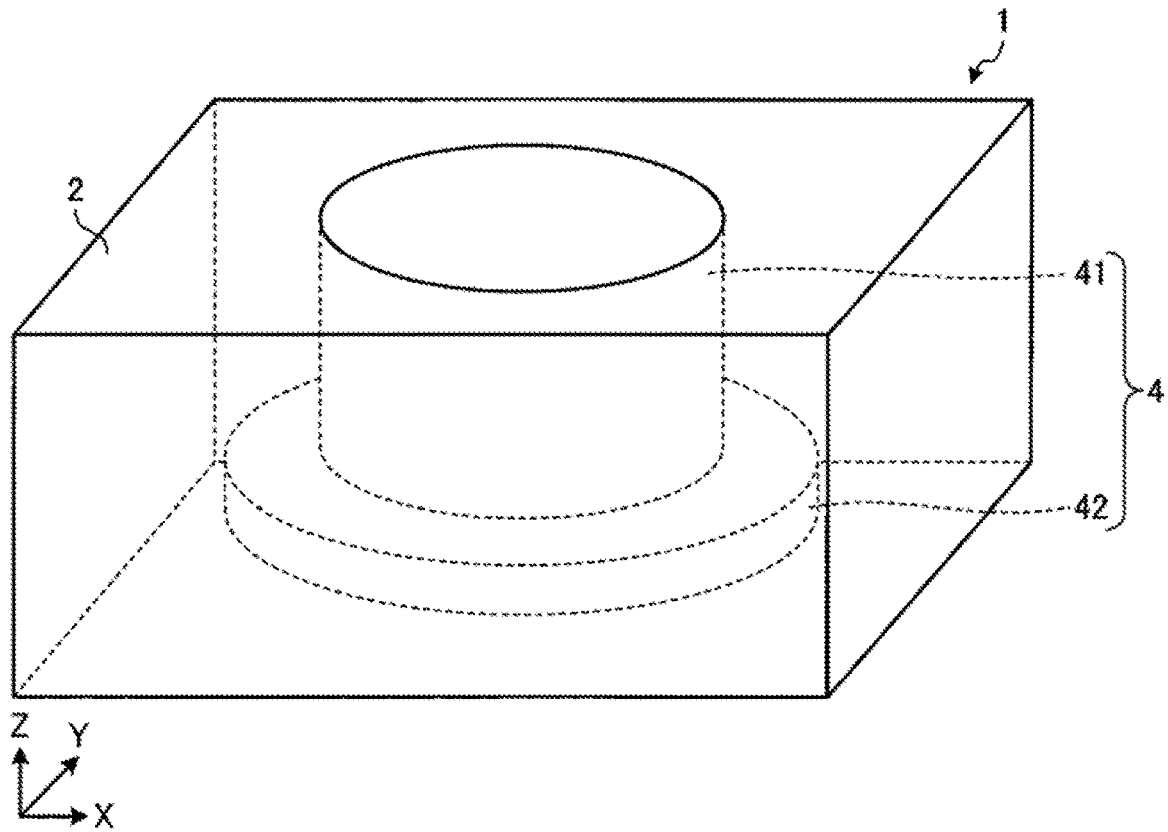
FIG. 1 is a perspective view illustrating a configuration of a template substrate according to one or more embodiments.

One or more example embodiments provide for a template substrate which can provide an improved structure, a method of manufacturing the template substrate, and a method of manufacturing a semiconductor device.

In general, according to one or more embodiments, a template substrate that can be used for forming a pattern is provided. The template substrate includes a pedestal portion on a first surface of a substrate. The template substrate defines an opening region provided in a second surface opposite to the first surface of the substrate. The opening region includes an opening end on a second surface side of the opening region adjacent to the second surface and a bottom surface on a first surface side of the opening region adjacent to the first surface. An area of the opening end is different from an area of the bottom surface.

Hereinafter, one or more embodiments of a template substrate according to a first aspect will be described in detail with reference to the accompanying drawings. The present disclosure is not limited to these embodiments.

First Aspect

One or more embodiments of a template substrate according to the first aspect will be described. Imprint lithography may be used to fabricate semiconductor devices. In imprint lithography, a template substrate having a step structure is manufactured, and a pattern (e.g. a concavo-convex pattern) is formed on a surface of the template substrate having the step structure. After a work substrate (e.g. a wafer) which is a target on which a pattern is transferred is provided and a resist is applied to the work substrate, the template substrate is adsorbed to a chuck mechanism, and stamping is performed in which the surface of the template substrate having the step structure is pushed against the resist on the work substrate. The template substrate can be formed of a light-transmitting material (e.g. transmissive in the visible spectrum) such as glass. After the resist on the work substrate is irradiated with light through the template substrate, a mold release process in which the template substrate is separated from the work substrate is performed. Thereby, a pattern on the surface of the template substrate having the step structure is transferred to the resist on the work substrate.

The template substrate may have a concave structure on a main surface opposite to a main surface on which the step structure is formed in the template substrate in order to reduce defects of the pattern at a transfer destination, and/or to shorten transfer time. The concave structure can be a substantially columnar counterbore shape having a predetermined diameter. Thereby, the template substrate can be bent at the time of stamping, the likelihood of air bubbles entering a resist can be reduced (that is, it is possible to reduce bubble biting, see FIG. 5B). In addition, by bending the template substrate at the time of releasing, the template substrate can be readily separated from the work substrate (see FIG. 5D).

The concave structure includes a step structure when viewed in a direction perpendicular to the main surface on which the step structure is formed. If a pattern area (e.g. the area of the step structure) of the template substrate is smaller than an area of the work substrate, the pattern can be transferred onto the surface of the work substrate by repeating the transfer. If the pattern area of the template substrate can be enlarged, the number of repetitions of the pattern transfer can be reduced and the total time for the pattern transfer onto the surface of the work substrate can be reduced, and thereby, productivity can be increased.

For example, if a diameter (for example, a diameter of the substantially columnar shape) of the concave structure is increased so as to increase the pattern area (which can increase the productivity), it can be difficult to secure a sufficient adsorption area when the template substrate is adsorbed to a chuck mechanism. Thereby, there is a possibility that dechucking occurs in which the template substrate is not adsorbed (is not fixed) by the chuck mechanism.

In one or more embodiments according to the first aspect, a concave structure in which an area of a bottom surface is larger than an area of an opening end in the template substrate, for example, can provide both an increase in productivity and securement of an adsorption area.

Figure 2:
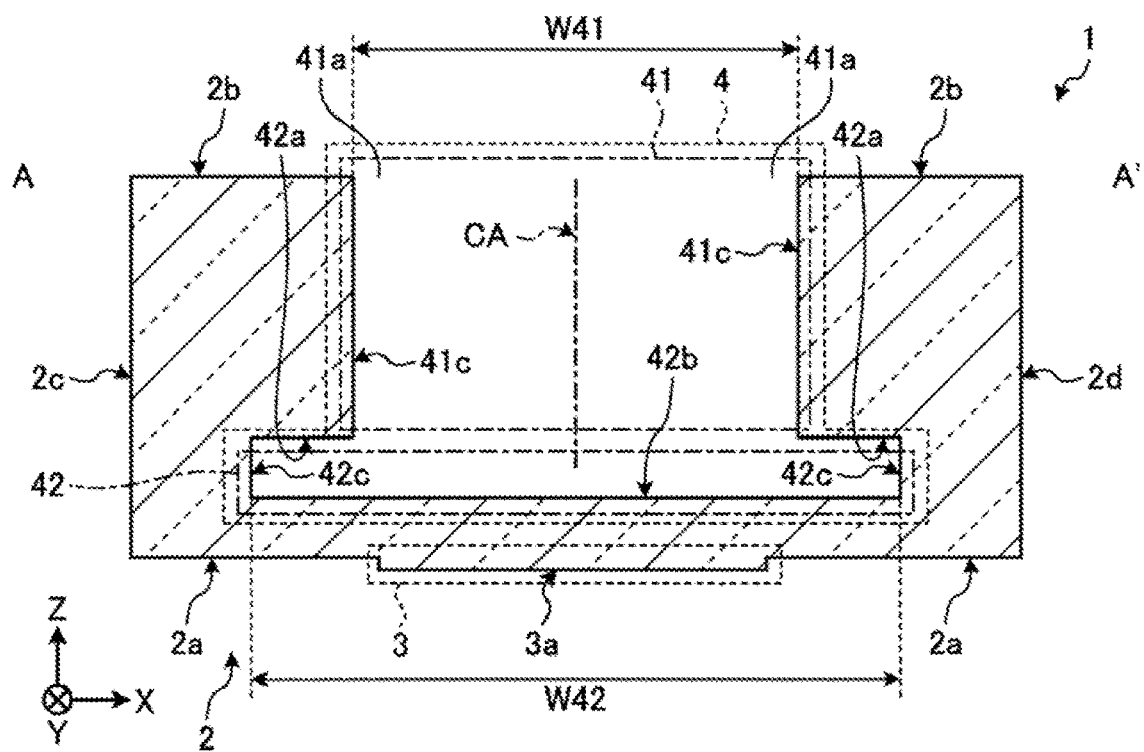
FIG. 2 is a sectional view illustrating the configuration of the template substrate according to one or more embodiments.
Figure 3:
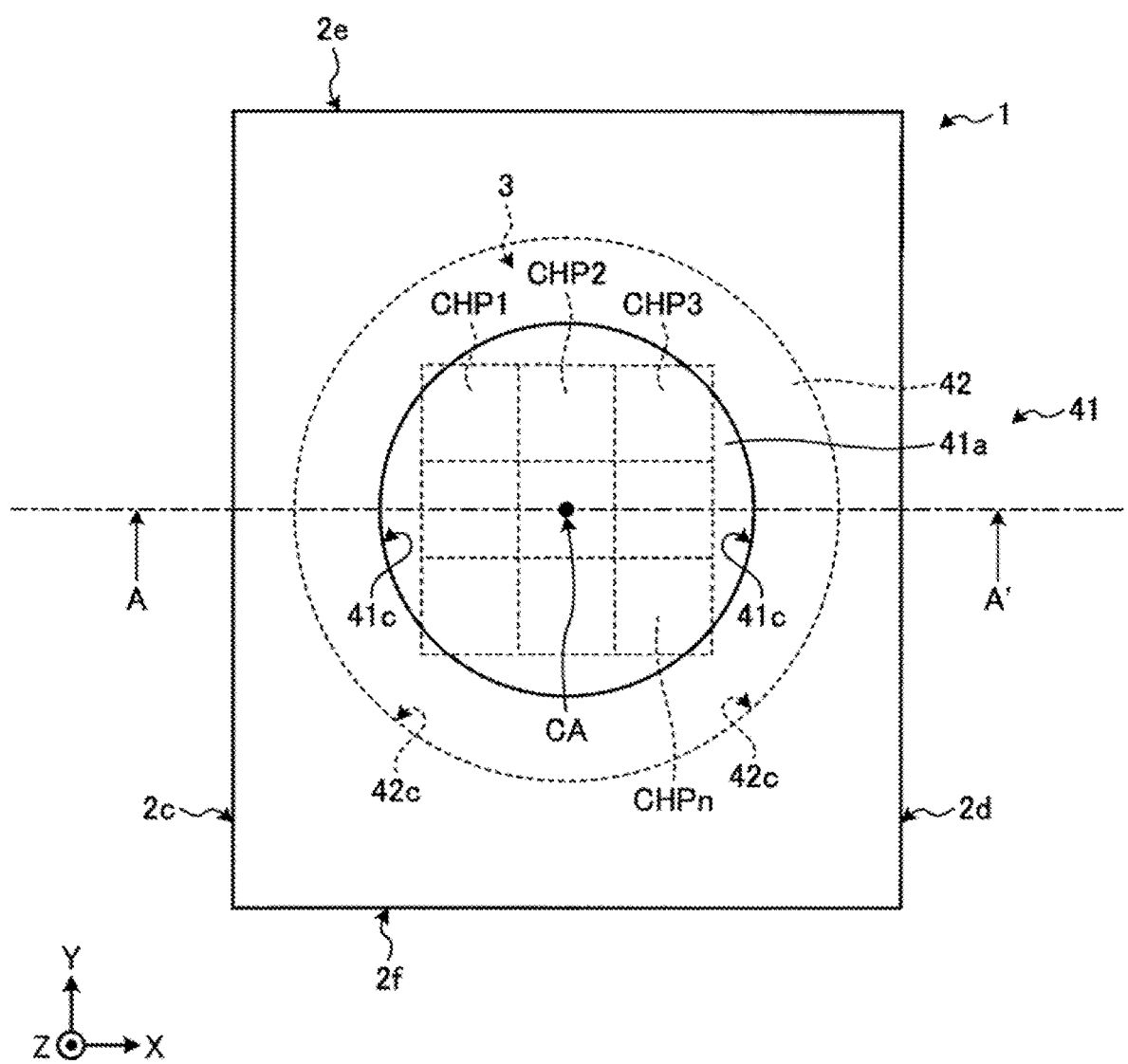
FIG. 3 is a plan view illustrating the configuration of the template substrate according to one or more embodiments.

A template substrate 1 can be configured as illustrated in FIGS. 1 to 3. FIG. 1 is a perspective view illustrating one or more embodiments of a configuration of the template substrate 1. FIG. 2 is a sectional view illustrating one or more embodiments of the configuration of the template substrate 1. FIG. 3 is a plan view illustrating one or more embodiments of the configuration of the template substrate 1. FIG. 2 illustrates a cross section taken along line A-A' of FIG. 3. In FIGS. 1 to 3, a direction perpendicular to a main surface 2a of the template substrate 1 is referred to as a Z direction, and two directions orthogonal to each other in a plane perpendicular to the Z direction are referred to as an X direction and a Y direction.

The template substrate 1 includes a substrate main body 2, a step structure 3, and a concave structure 4. The substrate main body 2 has a main surface (first main surface) 2a, a main surface (second main surface) 2b, and side surfaces 2c, 2d, 2e, and 2f. The main surface 2b is located on a side opposite to the main surface 2a of the substrate main body 2. The step structure 3 is disposed on the main surface 2a of the substrate main body 2. The step structure 3 has a mesa (e.g. pedestal) shape. A front surface 3a of the step structure 3 is a region where a pattern (concavo-convex pattern) is formed. FIG. 2 illustrates a case where the front surface 3a of the step structure 3 is flat and a mask is blank before a pattern is formed.

The concave structure 4 is disposed in the main surface 2b of the substrate main body 2. The concave structure 4 includes a recess or opening in the substrate main body 2. The concave structure 4 may be referred to herein as an opening region. As illustrated in FIG. 3, the concave structure 4 is disposed over the step structure 3 when viewed from a direction (+Z side in the Z direction) perpendicular to the main surface 2b. As illustrated in FIG. 2, in the concave structure 4, a size of an XY area (area in the XY plane) of an opening end 41a which is an end portion on the +Z side of the concave structure 4 is different from a size of an XY area of a bottom surface 42b which is an end portion of the concave structure 4 on the −Z side. The opening end 41a may be disposed adjacent to the main surface 2b, and the bottom surface 42b may be disposed adjacent to the main surface 2a. In the concave structure 4, the XY area of the bottom surface 42b is larger than the XY area of the opening end 41a (e.g. by a factor of about 1.1 or more, about 1.2 or more, or about 1.3). A diameter of a bottom portion of the concave structure 4 is larger than a diameter of a top portion of the concave structure 4 (e.g. by a factor of about 1.1 or more, about 1.2 or more, or about 1.3).

The concave structure 4 defines an opening region (first opening region) 41 and an opening region (second opening region) 42. The opening region 42 is disposed on the bottom surface 42b side from the opening region 41. The opening region 41 may be disposed adjacent to the main surface 2b. The opening region 41 and the opening region 42 may be connected. A maximum opening width W42 of the opening region 42 is larger than a maximum opening width W41 of the opening region 41. In FIG. 2, the maximum opening widths W42 and W41 correspond to diameters of the opening regions 42 and 41, respectively.

An inner side surface of the concave structure 4 has a staircase shape (that has two steps, for example) when viewed from a cross section on the ZX plane. The opening region 41 corresponds to a first step of the staircase shape, and the opening region 42 corresponds to a second step of the staircase shape. The concave structure 4 has inner side surfaces 41c, 42a, and 42c. The inner side surface 42c is farther away from a central axis CA of the concave structure 4 than are the inner side surfaces 42a and 41c. The inner side surface 42a is farther away from the central axis CA than is the inner side surface 41c. The inner side surfaces 41c, 42a, and 42c define a staircase shape (having two steps or stages, for example). The inner side surface 41c extends along the central axis CA. The inner side surface 42a extends in a direction substantially perpendicular to the center axis CA and connects an end portion of the inner side surface 41c to an end portion of the inner side surface 42c. The inner side surface 42c extends along the central axis CA. The inner side surface 42c is disposed closer to the bottom surface 42b than are the inner side surfaces 42a and 41c. The inner side surface 42a is disposed closer to the bottom surface 42b than is the inner side surface 41c. An interval space (maximum opening width W42) between regions of the inner side surface 42c facing each other across the concave structure 4 is larger than an interval (maximum opening width W41) between regions of the inner side surface 41c facing each other across the concave structure 4 (e.g. by a factor of about 1.1 or more, about 1.2 or more, or about 1.3 or more).

Thereby, the XY area of the opening end 41a of the concave structure 4 can be kept small (e.g. smaller than the XY area of the bottom surface 42b), and it is possible to secure a large area of the main surface 2b of the substrate main body 2 which is adsorbed to the chuck mechanism. In addition, since an area of the bottom surface 42b of the concave structure 4 can be secured to be large, it is possible to readily expand the area (pattern area) of the step structure 3, and to thereby readily increase productivity. At the same time, since the area of the bottom surface 42b of the concave structure 4 can be secured to be large, it is possible to reduce bubble biting at a contact portion between the template substrate and the work substrate when the template pattern is pushed against a resist.

As illustrated in FIG. 3, when viewed from a direction (+Z side in the Z direction) perpendicular to the main surface 2b, the opening region 41 can have a substantially circular planar shape, and the opening region 42 can have a substantially circular planar shape. In other embodiments, other shapes may be implemented (e.g. an oval shape, or a polygon shape). Each of the inner side surfaces 41c and 42c form a respective peripheral surface of, for example, respective cylinders).

FIG. 3 shows embodiments in which patterns to be formed on the front surface 3a of the step structure 3 are patterns CHP1 to CHPn (n is an arbitrary integer of 2 or more) of a plurality of chips, and the patterns CHP1 to CHPn of the plural chips collectively have an area that exceeds the area of the opening region 41 (e.g. by a factor of about 1.1 or more, about 1.2 or more, or about 1.3 or more) but are accommodated in the opening region 42. That is, FIG. 3 illustrates that since an area of the bottom surface 42b is larger than an area of the opening end 41a, it is possible to readily increase the number of chips which can transfer patterns at the same time.

A chip pattern illustrated in FIG. 3 is illustrated to include patterns of a plurality of chips, but the chip pattern may be for a single chip in some embodiments. In FIG. 3, the chip pattern is illustrated to be larger than the opening end 41a, but as illustrated in FIG. 2, the front surface 3a of the step structure 3 (and an area of the chip patterns, collectively) may be smaller than the opening end 41a.

Figure 4:
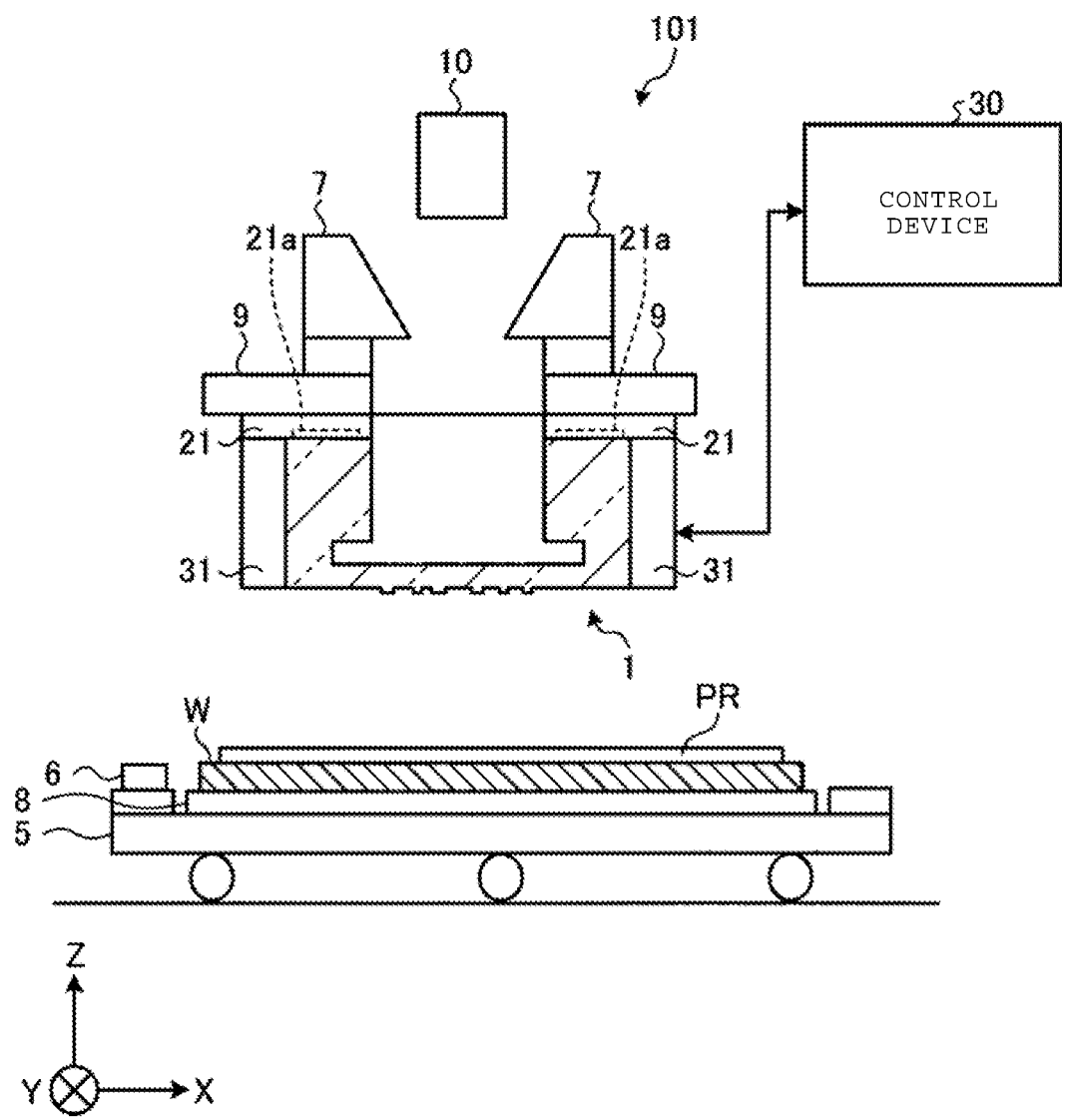
FIG. 4 is a view illustrating one or more embodiments of a configuration of an imprint apparatus in which the template substrate is used.

Next, an imprint apparatus 101 which uses the template substrate 1 will be described with reference to FIG. 4. FIG. 4 is a view illustrating a configuration of the imprint apparatus 101 which uses the template substrate 1. FIG. 4 illustrates the configuration when the imprint apparatus 101 is viewed in a Y axis direction. In the presently described embodiments, a surface on which a work substrate W is placed is an XY plane, and an upper surface of the work substrate W perpendicularly crosses the Z axis. The work substrate W is a semiconductor substrate including, for example, silicon or the like.

The imprint apparatus 101 includes an original plate stage 21, a sample stage 5, a reference mark 6, an alignment sensor 7, a substrate chuck 8, a stage base 9, a light source 10, a push portion 31, and a control device 30.

The sample stage 5 on which the work substrate W is mounted moves in a plane (e.g. in a horizontal plane) parallel to the mounted work substrate W. The sample stage moves the work substrate W, on whose surface (e.g. substantially the entire surface except edges of the surface) a resist PR as a transfer material is dropped or applied. In addition, when stamping processing for the work substrate W is performed, the sample stage 5 sequentially moves each shot region on the work substrate W toward a lower side of the template substrate 1.

The substrate chuck 8 is provided on the sample stage 5. The substrate chuck 8 fixes the work substrate W to a predetermined position on the sample stage 5. In addition, the reference mark 6 is provided on the sample stage 5. The reference mark 6 is used for detecting a position of the sample stage 5 and for positioning when the work substrate W is loaded onto the sample stage 5.

The original plate stage 21 is provided on a bottom side (on the work substrate W side) of the stage base 9. An original plate chuck 21a is provided on the original plate stage 21. The original plate chuck 21a fixes the template substrate 1 to a predetermined position, such as by vacuum adsorption (or electrostatic adsorption) or the like from a rear surface side (that is, the main surface 2b side) of the template substrate 1.

In addition, the push portion 31 is provided on a bottom side of the original plate stage 21. The push portion 31 is configured with an actuator or the like, and stress is applied to a side surface of the template substrate 1. The push portion 31 has a function (e.g. a function capable of pressing four side surfaces of the template substrate 1 independently of each other) of a manipulator. The push portion 31 adjusts a shape and a size of the template substrate 1 by pressing the template substrate 1 from one or more of the four side surfaces (for example, side surfaces 2c to 2f illustrated in FIG. 3) of the template substrate 1. Thereby, a planar shape of the step structure 3 of the template substrate 1 is deformed. As a result, position shift or the like of a pattern formed on the template substrate 1 can be adjusted.

The template substrate 1 is supported by the original plate stage 21, and the stage base 9 pushes a template pattern of the template substrate 1 against the resist PR on the work substrate W. The stage base 9 moves in the vertical direction (perpendicular direction), thereby, pushing (pressing) the template substrate 1 against the resist PR and separating (releasing) the template substrate 1 from the resist PR.

The resist PR used for imprinting is, for example, a resin (e.g. a photocuring agent) having characteristics such as photocurability. In addition, the alignment sensor 7 is provided on the stage base 9. The alignment sensor 7 detects a position of the work substrate W and detects a position of the template substrate 1.

The light source 10 emits light such as UV light, and is provided above the stage base 9. The light source 10 irradiates UV light from above the transparent template substrate 1 in a state where the template substrate 1 is pushed against the resist PR.

The control device 30 is communicatively connected to the elements of the imprint apparatus 101 (e.g. to each element) and controls one or more of the elements of the imprint apparatus 101. The control device 30 may include a processor and computer memory storing instructions that, when executed by the processor, cause the processor to perform functions including controlling one or more of the elements of the imprint apparatus 101 (e.g. to perform the processes described herein). FIG. 4 illustrates that the control device 30 is communicatively connected to the push portion 31, and does not illustrate connections with other elements—however, such connections may be implemented. The control device 30 controls the push portion 31 by sending a magnification input value (magnification adjustment value) to the push portion 31. The push portion 31 pushes or squeezes a side surface of the template substrate 1 with force having a magnitude corresponding to the magnification input value. Thereby, a pattern (e.g. a concavo-convex pattern) on the template substrate 1 can be set to a magnification corresponding to the magnification input value (magnification adjustment value) and can be transferred to the resist PR on the work substrate W.

Next, a sequence of imprint processes will be described with reference to FIGS. 5A to 5E. FIGS. 5A to 5E are process sectional views (view from the cross section ZX) illustrating one or more embodiments of a set of imprint processes. FIGS. 5A to 5E show one or more embodiments where the resist PR is supplied by an ink jet method and imprint processing is performed, but the template substrate 1 according to the presently described embodiments can also be applied to a case where the resist PR is supplied by a surface coating method and the imprint processing is performed.

Figure 5A:
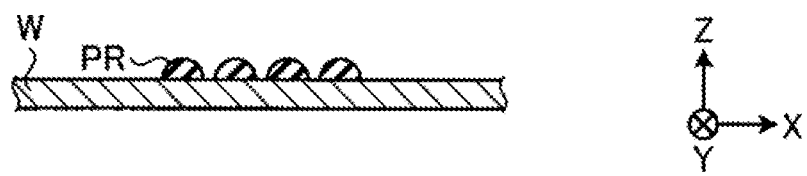
FIGS. 5A to 5E are views illustrating a stages of imprint processing according to one or more embodiments.

In a stage illustrated in FIG. 5A, the resist PR is dropped onto an upper surface of the work substrate W by an ink jet method. The resist PR is an imprint material such as a photocurable resin material. A low dielectric constant (low-K) film, an organic material, or the like is used for the resist PR.

Figure 5B:
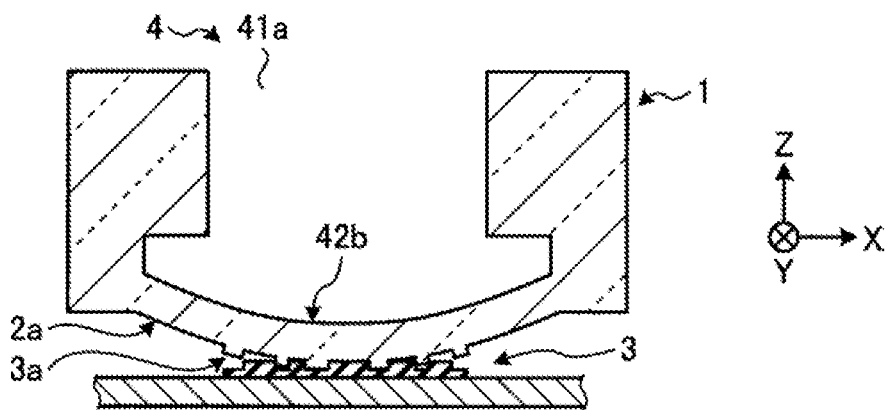

In a stage illustrated in FIG. 5B, the template substrate 1 having a pattern (a concavo-convex pattern) formed on the front surface 3a of the step structure 3 is provided. The step structure 3 of the template substrate 1 is moved above the resist PR and is pushed against the resist PR while bending the surfaces 2a and 3a of the template substrate 1. In the presently described embodiments, since the XY area of the bottom surface 42b of the concave structure 4 is secured to be larger than the XY area of the opening end 41 a, it is possible to readily bend a portion between the concave structure 4 and the step structure 3 on the template substrate 1. At this time, the step structure 3 of the template substrate 1 may be pushed against the resist PR after the magnification adjustment of the pattern is performed by pressing one or more of the side surfaces 2c to 2f of the template substrate 1. If the pattern of the front surface 3a of the step structure 3 comes into contact with the resist PR, the resist PR flows into the pattern (concavo-convex pattern) of the front surface 3a of the step structure 3 by the capillary phenomenon.

Figure 5C:
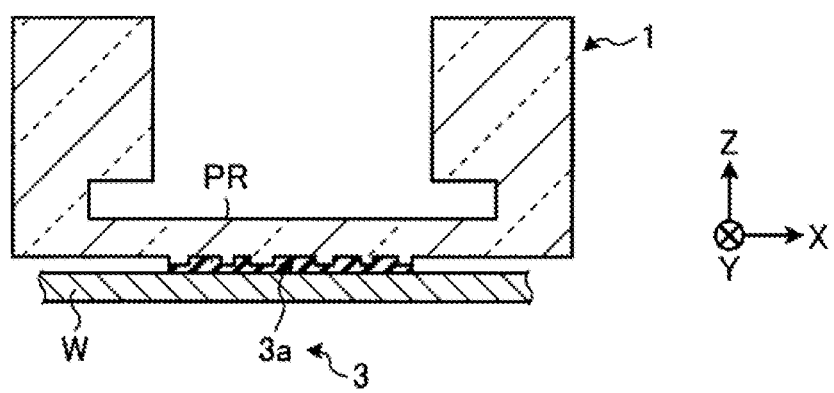

In a stage illustrated in FIG. 5C, the step structure 3 of the template substrate 1 comes into contact with the resist PR for a predetermined time. Thereby, the resist PR is filled in the pattern of the front surface 3a of the step structure 3. In this state, if light such as UV light from the light source 10 is applied to the resist PR via the template substrate 1, the resist PR is cured.

Figure 5D:
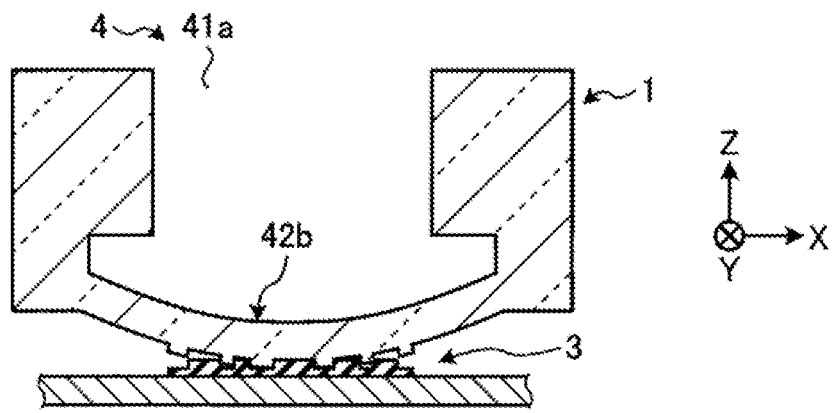

In a stage illustrated in FIG. 5D, the template substrate 1 is released from the cured resist PR on the work substrate W. At this time, since the XY area of the bottom surface 42b of the concave structure 4 is secured to be larger than the XY area of the opening end 41a, it is possible to readily bend the portion between the concave structure 4 and the step structure 3 on the template substrate 1 (e.g. to implement a release process).

Figure 5E:
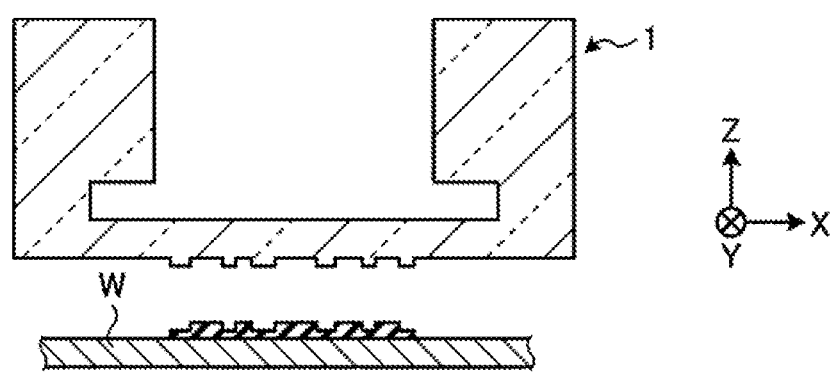

Thereby, as illustrated in FIG. 5E, the template substrate 1 is readily released from the cured resist PR on the work substrate W. The imprint apparatus 101 performs imprint processing for a first shot on the work substrate W, and thereafter, may perform imprint processing for a second shot on the work substrate W.

Next, a method of manufacturing the template substrate 1 will be described with reference to FIG. 6. FIG. 6 shows stages A through E illustrating one or more embodiments of the method of manufacturing the template substrate 1.

In stage A, a plate (first plate) 61 to be a part of the template substrate 1 is provided. The plate 61 can include a material whose main component (e.g. by weight) is a substance suitable for the template substrate 1, such as, glass (synthetic quartz glass, $TiO_2$—$SiO_2$ glass, soda lime glass, aluminosilicate glass, $CaF_2$ glass, and the like), sapphire, stainless steel (SUS) or quartz. Grinding and cutting are performed by using a tool such as a drill or a cutter mounted in a machining center, and an opening region 41 is formed in the plate 61. Coolant may be supplied to a processing site of the plate 61 during grinding and cutting. The opening region 41 is a region that can become a part of the concave structure 4 (see FIG. 2).

In stage B, a plate (second plate) 62 to be another part of the template substrate 1 is provided. The plate 62 can be formed of a material whose main component is a substance suitable for the template substrate 1, such as glass, sapphire, stainless steel (SUS), quartz or the like. Grinding and cutting are performed by using a tool such as a drill or a cutter mounted in a machining center, and an opening region 42 is formed in the plate 61. Coolant may be supplied to a processing site of the plate 62 during grinding and cutting. The opening region 42 is a region that can become another part of the concave structure 4.

In stage C, the plate 61 in which the opening region 41 is formed is bonded to the plate 62 in which the opening region 42 is formed. The bonding may be performed such that the opening region 41 and the opening region 42 are connected. For example, positioning of the plate 61 and the plate 62 is performed such that the opening region 41 is disposed inside the opening region 42 when viewed from a front surface 61a of the plate 61, and the plate 61 is bonded to the plate 62 by bonding device (not illustrated). Thereby, a bonded body 64 is obtained in which the plate 61 is bonded to the plate 62. The bonding can be performed by using a surface activation bonding method, an atomic diffusion bonding method, a welding method, an adhesive bonding method, an anode bonding method, a hydrofluoric acid bonding method, an optical contact method, a room temperature bonding method or the like.

For example, if the surface activation bonding method is used, an ion beam or plasma is applied to main surfaces (a rear surface 61b of the plate 61 and a front surface 62a of the plate 62) to be bonded to each of the plate 61 and the plate 62, and the main surfaces are physically activated by ion impact. Thereafter, the two activated main surfaces come into contact with each other, and thereby, the plate 61 is bonded to the plate 62. At this time, in order to increase a bonding strength, the plate 61 and the plate 62 may be pressurized from the outside and furthermore, may be heated.

In stage D, a plate (third plate) 63 to be another part of the template substrate 1 is provided. The plate 63 can be formed of a material whose main component (e.g. by weight) is a substance suitable for the template substrate 1, such as glass or quartz. The step structure 3 of a mesa shape is formed on a front surface 63a of the plate 63 by an imprint lithography method, a photolithography method, an electron beam drawing method, an etching method or the like. A pattern (e.g. a concavo-convex pattern) to be transferred to the work substrate W is formed on the front surface 3a of the step structure 3. The concavo-convex pattern is formed by, for example, imprint transfer which uses a resist supplied to the front surface 3a, an electron beam drawing method or the like.

In stage E, the plate 63 is bonded to the bonded body 64. For example, positioning of the plate 63 and the bonded body 64 is performed such that the step structure 3 is disposed inside the opening region 42 when viewed from a front surface 64a of the bonded body 64, and the plate 63 is bonded to the bonded body 64 by the bonding device (not illustrated). Thereby, a bonded body 65 is obtained in which the plate 63 is bonded to the bonded body 64. The bonding can be performed by using a surface activation bonding method, an atomic diffusion bonding method, a welding method, an adhesive bonding method, an anode bonding method, a hydrofluoric acid bonding method, an optical contact method, a room temperature bonding method or the like.

For example, if the surface activation bonding method is used, an ion beam or plasma is applied to main surfaces (a rear surface 63b of the plate 63 and a front surface 64a of the bonded body 64) to be bonded to each of the plate 63 and the bonded body 64, and the main surfaces are physically activated by ion impact. Thereafter, the two activated main surfaces come into contact with each other, and thereby, the plate 63 is bonded to the bonded body 64. At this time, in order to increase a bonding strength, the plate 63 and the bonded body 64 may be pressed from the outside or may be heated. A step structure 3 (e.g. having a mesa shape) can be formed on the bonded bond 65. A pattern (e.g. a concavo-convex pattern) to be transferred to a work substrate W can be formed on the bonded bond 65.

As described above, in the embodiment, the concave structure 4 of the template substrate 1 is configured so that an XY area of the bottom surface 42b is larger than an XY area of the opening end 41a. Thereby, a large XY area of the bottom surface 42b can be secured and a large pattern area can be obtained, and thus, it is possible to reduce a number of repetitions of a pattern transfer process and to increase productivity. In addition, since the XY area of the opening end 41a can be kept small, the XY area of the main surface 2b of the substrate main body 2 to be adsorbed to the chuck mechanism can be secured to be large. Furthermore, since a large XY area of the bottom surface 42b of the concave structure 4 can be secured, a bubble biting effect can be reduced when the template substrate 1 is pushed onto a work substrate at the time of pattern transfer. As a result, it is possible to achieve both an increase in productivity and securement of a suitable adsorption area.

In addition, in the presently described embodiments, since an area of the bottom surface 42b of the concave structure 4 can be secured to be large, it is possible to readily perform release of the template substrate 1 from the work substrate W after pattern transfer is performed, and also to thereby increase productivity.

In addition, in the presently described embodiments, the maximum opening width W42 of the opening region 42 is larger than the maximum opening width W41 of the opening region 41, in the concave structure 4. Thereby, it is possible to readily achieve the concave structure 4 in which an area of the bottom surface 42b is larger than an area of the opening end 41a.

In one or more embodiments, when viewed in a direction (+Z side in the Z direction) perpendicular to the main surface 2b, both the opening region 41 and the opening region 42 may have a substantially elliptical planar shape, and both the opening region 41 and the opening region 42 may have a substantially rectangular planar shape.

Figure 7:
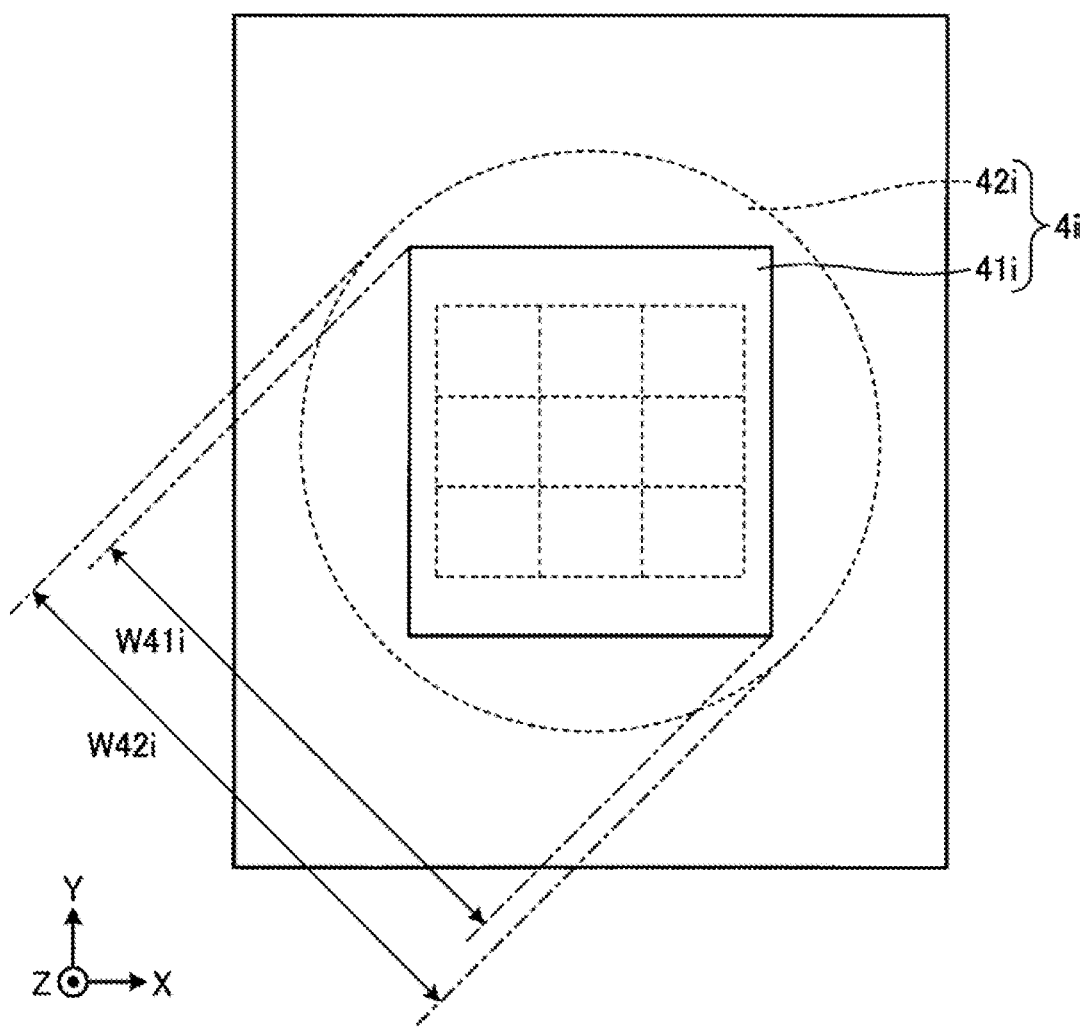
FIG. 7 is a plan view illustrating one or more embodiments of a configuration of a template substrate according to a modification example.

Referring now to FIG. 7, in one or more embodiments, when viewed in a direction (the +Z side in the Z direction) perpendicular to the main surface 2a, an opening region 41i and an opening region 42i in a concave structure 4i may have planar shapes different from each other. For example, as illustrated in FIG. 7, when viewed in the direction (+Z side in the Z direction) perpendicular to the main surface 2a, the opening region 41i can have a substantially rectangular planar shape and the opening region 42i can have a substantially circular or elliptical planar shape. Also, a maximum opening width W42i of the opening region 42i can be larger than a maximum opening width W41i of the opening region 41i (e.g. by a factor of about 1.1 or more, about 1.2 or more, or about 1.3 or more), and the concave structure 4i in which an area of the bottom surface 42b is wider than an area of the opening end 41a can be readily achieved.

Figure 8:
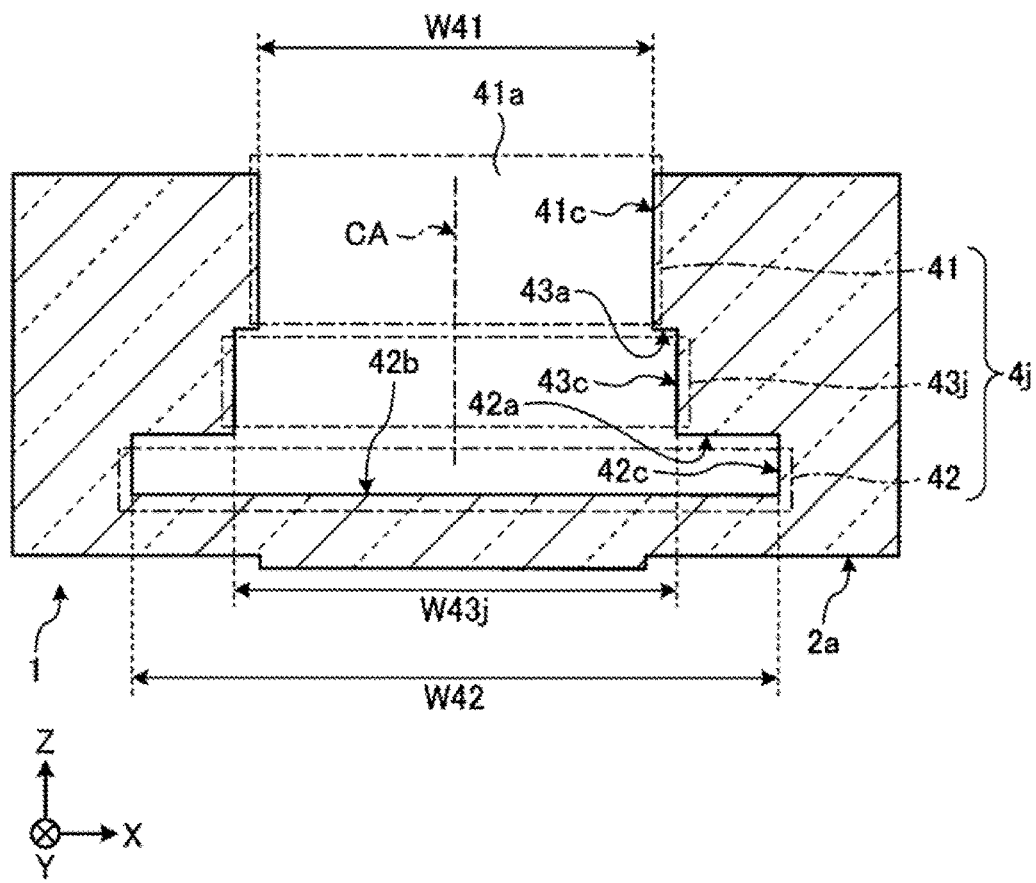
FIG. 8 is a sectional view illustrating one or more embodiments of a configuration of a template substrate according to another modification example.

As illustrated in FIG. 8, in one or more embodiments a concave structure 4j may have an opening region (third opening region) 43j between the opening region (first opening region) 41 and the opening region (second opening region) 42. A maximum opening width W43j of the opening region 43j is larger than a maximum opening width W41 of the opening region 41 and is smaller than the maximum opening width W42 of the opening region 42.

In this case, an inner side surface of the concave structure 4j may have a multistage staircase shape when viewed from the cross section ZX. For example, the opening region 41 corresponds to a first step of the staircase shape, the opening region 43j corresponds to a second step of the staircase shape, and the opening region 42 corresponds to a third step of the staircase shape. The concave structure 4j has the inner side surfaces 42a, 43c, 43a, and 41c which are sequentially farther away from the center axis CA of the concave structure 4j (with the inner side surface 42c being the farthest away) in a staircase shape (that has, for example, three steps). The inner side surface 41c extends along the central axis CA. The inner side surface 43a extends in a direction substantially perpendicular to the central axis CA and connects an end portion on the bottom surface 42b side of the inner side surface 41c to an end portion on the opening end 41a side of the inner side surface 43c. The inner side surface 43c extends along the central axis CA. The inner side surface 42a extends in a direction substantially perpendicular to the central axis CA and connects an end portion on the bottom surface 42b side of the inner side surface 43c to an end portion on the opening end 41a side of the inner side surface 42c. The inner side surface 42c extends along the central axis CA. A space (e.g. the maximum opening width W43j) between regions of the inner side surface 43c facing each other across the concave structure 4j is larger than a space (the maximum opening width W41) between regions of the inner side surface 41c facing each other across the concave structure 4j, and is smaller than a space (the maximum opening width W42) between regions of the inner side surface 42c facing each other across the concave structure 4j.

A large area of the bottom surface 42b can also be secured and an area of the opening end 41a can also be kept small even with such a configuration, and thus, it is possible to achieve both an increase in productivity and securement of an adsorption area.

Figure 9:
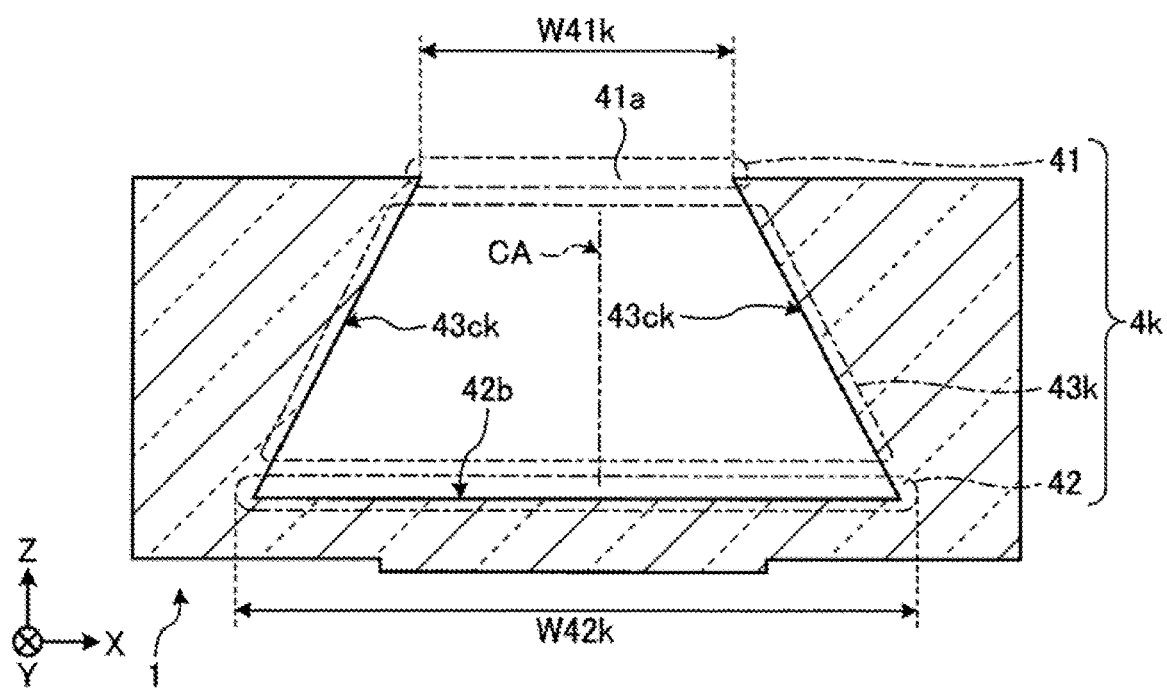
FIG. 9 is a sectional view illustrating one or more embodiments of a configuration of a template substrate according to still another modification example.

As illustrated in FIG. 9, a concave structure 4k defines an opening region (third opening region) 43k between the opening region (first opening region) 41 and the opening region (second opening region) 42. A maximum opening width of the opening region 43k continuously changes (e.g. monotonically increase) from a maximum opening width W41k at the opening region 41 to a maximum opening width W42k at the opening region 42, along a direction from the opening region 41 to the opening region 42.

An inner side surface of the concave structure 4k may have an inclined shape as when viewed from the cross section ZX. The concave structure 4k has an inner side surface 43ck which is inclined, and which becomes farther away from the central axis CA along a direction from the opening region 41 to the opening region 42. A width between regions on the inner side surface 43ck facing each other across the concave structure 4k continuously changes from an initial value of W41k to a final value of W42k along a direction from the opening region 41 to the opening region 42.

A large area of the bottom surface 42b can also be secured and an area of the opening end 41a can also be kept small with such a configuration, and thus, it is possible to achieve both an increase in productivity and securement of an adsorption area.

Figure 10:
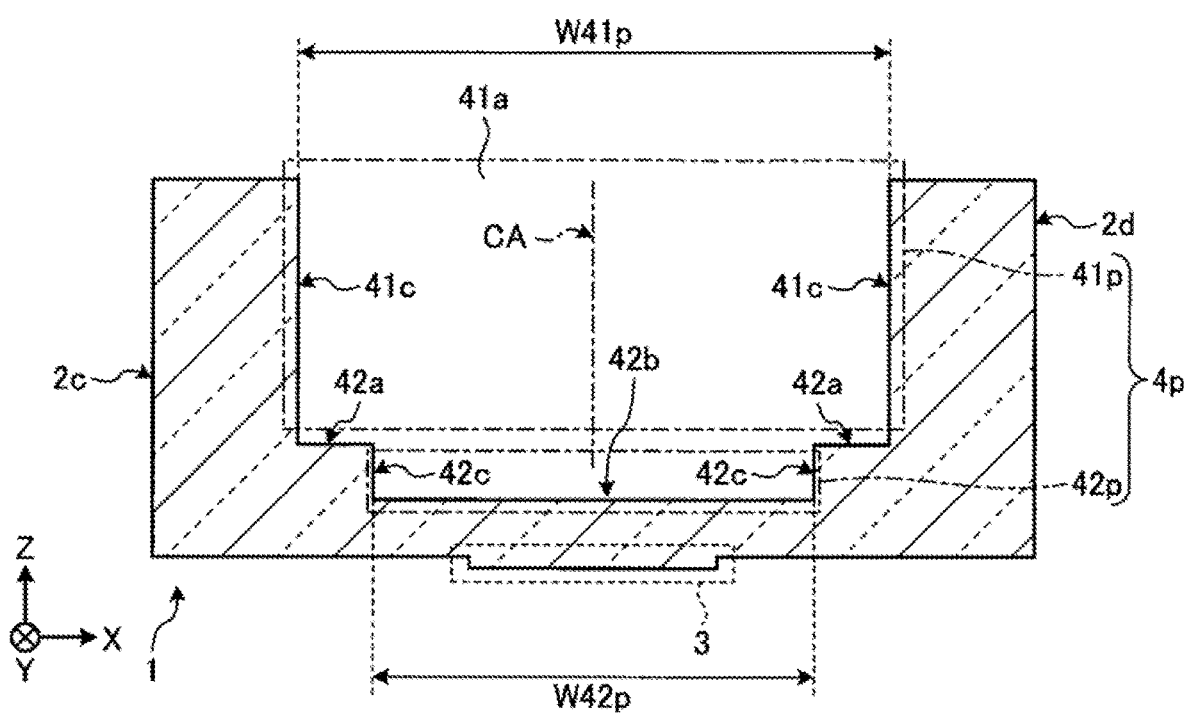
FIG. 10 is a sectional view illustrating one or more embodiments of a configuration of a template substrate according to still another modification example.

Referring now to FIG. 10, in one or more embodiments a concave structure 4p may have a shape in which a maximum opening width on the bottom surface 42b side is smaller than a maximum opening width on the opening end 41a side. For example, as illustrated in FIG. 10, a maximum opening width W42p of the opening region 42p may be smaller than a maximum opening width W41p of the opening region 41p, in the concave structure 4p (e.g. by a ratio of 0.9 or less, 0.8 or less, or 0.7 or less).

An inner side surface of the concave structure 4p has a staircase shape (of two steps, for example) when viewed from the cross section ZX. The opening region 41p corresponds to a first step of the staircase shape, and the opening region 42p corresponds to a second step of the staircase shape. The concave structure 4p has inner side surfaces 41c, 42a, and 42c defining a staircase shape (of two steps, for example). The inner side surface 41c extends along the central axis CA. The inner side surface 42a extends in a direction substantially perpendicular to the center axis CA and connects an end portion on the bottom surface 42b side of the inner side surface 41c to an end portion on the opening end 41a side of the inner side surface 42c. The inner side surface 42c extends along the central axis CA. An interval (maximum opening width W42p) between regions on the inner side surface 42c facing each other across the concave structure 4p is smaller than an interval (maximum opening width W41p) between regions on the inner side surface 41c facing each other across the concave structure 4p.

With the configuration described above, a planar width of the substrate main body 2 on the concave structure 4p side can be secured to be large in the vicinity of the step structure 3 (e.g. by reducing a size of an opening portion 42p of the concave structure 4p), and thus, it is possible to adjust the degree of bending of the surface 42b and the surface of the step structure 3 of the template substrate 1 by controlling pressure applied to the template substrate 1 during stage 5B to 5D. Furthermore, since the portion of the substrate main body 2 whose planar width is widened is limited to the vicinity of the step structure 3, it is possible to maintain ease of release of the template substrate 1 from the work substrate W of the template substrate 1 after a pattern transfer process is performed.

As used herein, the singular terms "a," "an," and "the" may include plural referents unless the context clearly dictates otherwise. In the description of some embodiments, a component provided "on," "above," or "over" another component can encompass cases where the former component is directly on (e.g., in physical contact with) the latter component, as well as cases where one or more intervening components are located between the former component and the latter component.

As used herein, the terms "about" and "substantially" are used to describe and account for small variations. When used in conjunction with an event or circumstance, the terms "about" and "substantially" can refer to instances in which the event or circumstance occurs precisely as well as instances in which the event or circumstance occurs to a close approximation. For example, when used in conjunction with a numerical value, the terms "about" and "substantially" can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

While certain embodiments have been described, these embodiments have been presented byway of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A method of manufacturing a template substrate comprising:
    providing a first plate defining a first opening which penetrates the first plate;
    providing a second plate defining a second opening with an opening diameter different from an opening diameter of the first opening, and which penetrates the second plate;
    providing a third plate having a pedestal portion on a first surface; and
    bonding the first plate to the second plate, and bonding at least one of the first plate or the second plate to the third plate such that the first surface of the third plate is exposed.

2. The method of manufacturing the template substrate according to claim 1,
    wherein the bonding is performed such that the first opening and the second opening are connected.

3. The method of manufacturing the template substrate according to claim 1, wherein the second plate is bonded to the third plate, and wherein the opening diameter of the second opening is greater than an opening diameter of the first opening.

4. The method of manufacturing the template substrate according to claim 1, wherein the second plate is bonded to the third plate, and wherein the opening diameter of the second opening is less than an opening diameter of the first opening.

* * * * *